(12) United States Patent
Mather

(10) Patent No.: US 6,473,484 B1
(45) Date of Patent: Oct. 29, 2002

(54) BINARY COUNTER AND METHOD FOR COUNTING TO EXTEND LIFETIME OF STORAGE CELLS

(75) Inventor: Robert P. Mather, Mesa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/608,805

(22) Filed: Jun. 30, 2000

Related U.S. Application Data

(63) Continuation of application No. 09/133,394, filed on Aug. 13, 1998, now Pat. No. 6,084,935.

(51) Int. Cl.[7] .............................................. G06M 3/00
(52) U.S. Cl. ............................... 377/26; 377/28; 377/34
(58) Field of Search ............................. 377/34, 26, 28

(56) References Cited

U.S. PATENT DOCUMENTS 5,450,460 A     9/1995  Stodieck ..................... 377/44
5,675,622 A  * 10/1997  Hewitt et al. ................ 377/33

FOREIGN PATENT DOCUMENTS

EP        0484259     10/1991
FR        2707027      6/1993

* cited by examiner

Primary Examiner—Margaret R. Wambach
(74) Attorney, Agent, or Firm—Baker Botts L.L.P.

(57) ABSTRACT

A digital counter and method for counting are implemented which minimize fatigue-related failure in the storage element for the count value. The counting sequence is chosen such that the transitions within individual storage elements are the same for each element within a complete counting cycle. The invention extends to software or microcontroller implemented methods for counting, including encoding and decoding applications.

24 Claims, 1 Drawing Sheet

Example Sequences For 4-bit Counter

ND METHOD FOR
BINARY COUNTER AND METHOD FOR COUNTING TO EXTEND LIFETIME OF STORAGE CELLS

This case is a continuation of Ser. No. 09/133,394, filed Aug. 13, 1998 now U.S. Pat. No. 6,084,935.

FIELD OF THE INVENTION

This invention relates generally to digital counters, and more specifically, to a digital counter using a sequence of bit combinations chosen to distribute storage cell changes uniformly, which equalizes fatigue among the storage cells in the counter. This invention also relates to general purpose computers using non-volatile storage to store count values.

DESCRIPTION OF THE PRIOR ART

Binary codes have been adapted for different purposes in the history of the art. The BCD (Binary Coded Decimal) and Gray codes circuits. The BCD code, which is well known in the art, was created to facilitate the translation of standard binary data to human interface compatible decimal information. The Gray code, which is also well known in the art, was created to minimize the bit changes between codes, allowing only one bit change per count step in a counting sequence. This minimizes the impact of a single bit error in counters and communication systems and can reduce power consumption in some circuits. With certain types of non-volatile storage, fatigue due to state changes in binary cells creates a limited lifetime. FLASH and EEPROM (Electrically Erasable Programmable Read-Only Memory) exhibit lifetimes which may range as low as ten thousand state changes before the storage cell fails. Counters and other digital circuits which utilize non-volatile storage elements are of limited life span. This type of storage for counters can be used in RTC (Real Time Clock) circuits in personal computers and other systems such as event counters which have slowly changing count values and must maintain integrity during power failure or power down states.

Therefore, a need exists to reduce the impact of cell change fatigue in circuits employing these forms of non-volatile storage. The standard binary code does not fill this need, since the least significant bit of a standard binary counter changes with every clock, while the most significant bit only changes twice before the counter overflows. The Gray code also does not fill this need, since the code was designed to minimize changes in the number of bit per count cycle and not to spread the number of changes between all of the cells in the counter or other digital circuit.

The present invention fills this need by using a type of binary coding which subjects each cell in the counter or other digital circuit to the same number of changes for a complete count cycle. When this type of code is a Gray code it is known in the mathematical arts as a "Uniformly Balanced Gray Code". This maximizes the reliability of the counter or other digital circuit.

The limitation that this code be a Gray code is not necessary to the present invention, but is preferred for more reliable operation of the counter, since only one bit changes state per count. Another type of code known as "Balanced Gray Code" could be used, but is not preferred because it makes the number of transitions on each bit cell per counter cycle only approximately equal. This would enhance, but not maximize the reliability of the counter.

While the primary purpose of the invention is to increase the reliability of storage cells used to hold a count value, other applications for this counter and method for counting are envisioned, which include encoding and decoding secure transmissions.

SUMMARY OF THE INVENTION

In accordance with one embodiment of the present invention, it is an object of the present invention to provide a digital counter and a method for counting to increase the life span of storage cells.

In accordance with another embodiment of the present invention, it is an object of the present invention to provide a method for counting within a microprocessor or microcontroller based system which increases the life span of storage cells used to maintain count values.

In accordance with another embodiment of the present invention, it is an object of the present invention to provide a method for counting within software executing on a digital computer which increases the life span of storage cells used to maintain count values.

In accordance with another embodiment of the present invention, it is an object of the present invention to provide a counter and method for counting which enhance the performance of a counting system such as providing security by using a counting sequence as part of an encoding or decoding process.

BRIEF DESCRIPTION OF THE PREFERRED EMBODIMENT

In accordance with one embodiment of the present invention, a digital counter is implemented. This counter uses a state logic which creates a uniform distribution of state changes among the bits in the counter. Creating a uniform distribution of state changes increases the reliability of the counter by distributing fatigue evenly among the individual cells in the storage for the count value, and may be used for other performance advantages including increased security.

In accordance with another embodiment of the present invention, a method for counting is provided for a microprocessor or microcontroller based system using non-volatile storage either integrated or provided externally. This method will increase the reliability of the storage, since the individual cells will be fatigued at the same rate, and may provide other performance advantages to a microprocessor system such as increased security.

In accordance with another embodiment of the present invention, a method for counting is provided for use in a general purpose digital computer using non-volatile storage. This will increase the reliability of the storage, since the individual cells will be fatigued at the same rate, and may provide other performance advantages to a digital computer such as increased security.

The foregoing and other objects, features, and advantages of the invention will be apparent from the following, more particular, description of the preferred embodiment of the invention, as illustrated in the accompanying drawings.

DETAILED DESCRIPTION OF THE PREFERRED EMBODIMENT

Figures 1, 2:
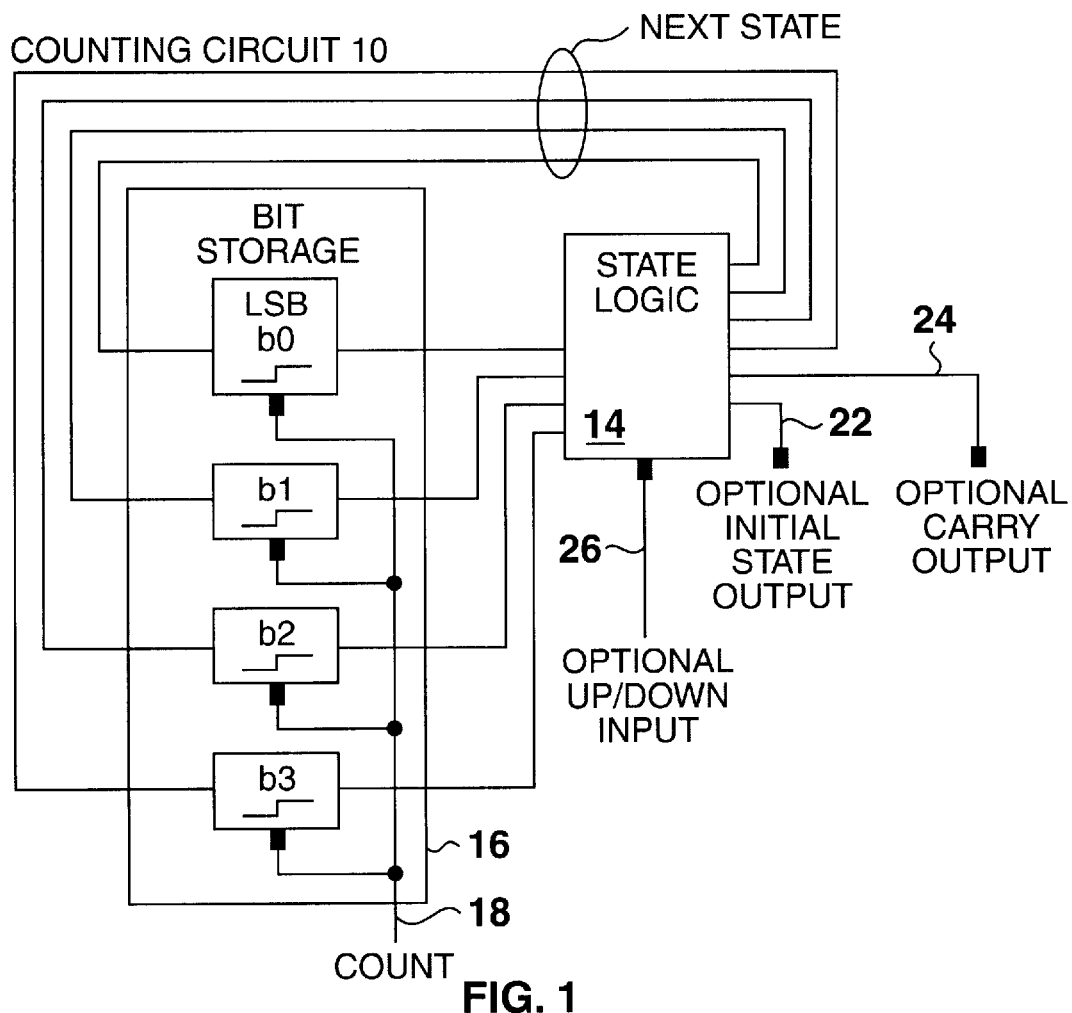
FIG. 1 is a simplified electrical diagram of the counter.
FIG. 2 is a set of tables containing example codes.

Referring to FIG. 1, a counting circuit 10 is implemented with a bit storage 16 and a state logic 14. The state logic 14 computes the next state of the bit storage 16 and when the count signal 18 is activated, the bit storage 18 assumes the next state. After a number of count signal 18 transitions have occurred corresponding to $2^N$ transitions, where N is the number of bits in the bit storage 16, a count cycle is complete.

FIG. 1 describes a 4-bit counter implementation. The size of the counter is exemplary only, as any number of bits may be used. In the preferred embodiment, the state logic 14 is designed such that only one of the bits in the bit storage 16 changes state at each count 18 and the total number of transitions at each bit in the bit storage 18, is equal for an entire count cycle. It is possible to cascade several counting circuits 10, but the cascaded (higher order) counting circuits 10 will not be exercised as frequently as the first counting circuit 10 and some of the advantages of the preferred invention will be lost.

The optional carry output 22 and initial state output 24 signals can be provided for cascading counting circuits 10.

The preferred embodiment of the counting circuit 10 is a single counter with a bit storage element 16 as wide as necessary to produce the desired count. This ensures the maximum reliability of the counting circuit 10 as all bits in the bit storage 16 will undergo the same number of transitions in a count cycle.

The method for counting parallels the operation of the counting circuit 10. A microprocessor, microcontroller or general purpose computer can retrieve a stored count value and compute a next state for the count using a look-up table or other means. The storage for the count value which is typically in non-volatile memory will have enhanced reliability as in the counting circuit 10, as the count value stored in non-volatile memory will have bit changes evenly spread among the bits for an entire count cycle.

Referring to FIG. 2, three sets of codes to implement the method for counting and the state logic 14 (FIG. 1) in the counting circuit 10 (FIG. 1) are shown. There are many other possible codes which will achieve the desired result of equalizing the number of bit transitions per count cycle, but for a 4-bit counter, any of the example codes will suffice. Counters with higher numbers of bits can be designed using similar tables.

These codes can be rotated in sequence, the initial code being chosen at any point in the count cycle, without any degradation in performance. Likewise the codes can be rotated in bit position or reversed in sequence without any degradation in performance. This makes the operation of an up/down counter feasible using these codes.

In an up/down configuration, the instantaneous bit transition counts per bit cell may not be equal, since the count cycle may not complete in one direction, but enhanced reliability will still result. To cascade counters or achieve an overflow or underflow indication a decode of the final state or initial state, respectively, should be provided by the state logic 14 (FIG. 1). Since an ideal N-bit counter will undergo $2^N/N$ or $2^N/N-1$ transitions on each of its bits, the carry or initial state output should be derived from a decode of the count value and not the most significant bit of the counter as is done in some applications.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A microcontroller having a counter sequenced to extend the lifetime of a non-volatile memory which stores the counter bit values, comprising:

a microcontroller having a non-volatile memory; and said non-volatile memory having a plurality of bit storage elements for storing a count value;

wherein said microcontroller computes a next state of said plurality of bit storage elements and changes each of said plurality of bit storage elements substantially the same number of times before said count value is repeated.

2. The microcontroller in accordance with claim 1 for increasing the reliability of said plurality of bit storage elements.

3. The microcontroller in accordance with claim 1 for encoding data.

4. The microcontroller in accordance with claim 1 for decoding data.

5. The microcontroller in accordance with claim 1 wherein said plurality of bit storage elements comprise FLASH memory cells.

6. The microcontroller in accordance with claim 1 wherein said plurality of bit storage elements comprises EEPROM cells.

7. The microcontroller in accordance with claim 1 wherein said state logic changes only one of said plurality of bit storage elements for each state transition.

8. The microcontroller in accordance with claim 7 wherein said plurality of bit storage elements comprises FLASH memory cells.

9. The microcontroller in accordance with claim 7 wherein said plurality of bit storage elements comprises EEPROM cells.

10. The microcontroller in accordance with claim 7 wherein said count value follows a sequence 0, 1, 3, 7, 15, 11, 9, 8, 10, 2, 6, 14, 12, 13, 5, 4, herein expressed decimally.

11. The microcontroller in accordance with claim 7 wherein said count value follows a sequence 0, 1, 3, 7, 15, 11, 9, 8, 12, 13, 5, 4, 6, 14, 10, 2, herein expressed decimally.

12. The microcontroller in accordance with claim 7 wherein said count value follows a sequence 0, 1, 3, 7, 15, 11, 10, 8, 9, 13, 5, 4, 12, 14, 6, 2, herein expressed decimally.

13. A method for counting with a microcontroller, said method comprising the steps of:

providing in a microcontroller a plurality of bit storage elements for storing a binary number containing an initial value;

retrieving said binary number;

computing a next number from said binary number wherein said next number is chosen such that each bit in said binary number changes substantially the same number of times before said next number is equal to said initial value; and storing said next number.

14. A method for counting in accordance with claim 13 for increasing the reliability of said plurality of bit storage elements.

15. A method for counting in accordance with claim 13 for encoding data.

16. A method for counting in accordance with claim 13 for decoding data.

17. A method for counting in accordance with claim 13 wherein said plurality of bit storage elements comprises FLASH memory cells.

18. A method for counting in accordance with claim 13 wherein said plurality of bit storage elements comprises EEPROM cells.

19. A method for counting in accordance with claim 13 wherein said next number only differs by one bit from said binary number.

20. A method for counting in accordance with claim 19 wherein said plurality of bit storage elements comprises FLASH memory cells.

21. A method for counting in accordance with claim 19 wherein said plurality of bit storage elements comprises EEPROM cells.

22. A method for counting in accordance with claim 19 wherein said binary number follows a sequence 0, 1, 3, 7, 15, 11, 9, 8, 10, 2, 6, 14, 12, 13, 5, 4, herein expressed decimally.

23. A method for counting in accordance with claim 19 wherein said binary number follows a sequence 0, 1, 3, 7, 15, 11, 9, 8, 12, 13, 5, 4, 6, 14, 10, 2, herein expressed decimally.

24. A method for counting in accordance with claim 19 wherein said binary number follows a sequence 0, 1, 3, 7, 15, 11, 10, 8, 9, 13, 5, 4, 12, 14, 6, 2, herein expressed decimally.

* * * * *